United States Patent [19]

Marik

[11] 3,835,424

[45] Sept. 10, 1974

[54] CHANNEL INDICATOR AND DISPLAY ARRANGEMENT UTILIZING D-C TUNING VOLTAGES OF VARACTOR TUNER

[75] Inventor: Charles J. Marik, Chicago, Ill.

[73] Assignee: Motorola, Inc., Chicago, Ill.

[22] Filed: Nov. 28, 1973

[21] Appl. No.: 419,736

[52] U.S. Cl. .................................. 334/87, 325/455
[51] Int. Cl. ............................................ H03j 1/04
[58] Field of Search .......... 334/86, 87, 15; 325/455; 116/124.1 R

[56] References Cited

UNITED STATES PATENTS

| | | | |
|---|---|---|---|
| 3,244,983 | 4/1966 | Ertman | 325/455 |
| 3,735,268 | 5/1973 | Dorsey et al. | 325/455 X |
| 3,753,119 | 8/1973 | Close | 334/86 X |
| 3,758,853 | 9/1973 | Dionne et al. | 325/455 X |

*Primary Examiner*—Paul L. Gensler
*Attorney, Agent, or Firm*—Donald B. Southard; V. J. Rauner

[57] ABSTRACT

An improved channel indicator and display arrangement especially suited for television receivers with varactor tuner mechanisms. The disclosed arrangement operates directly from the dc tuning voltages themselves wherein the output frequency of a dc controlled oscillator is made to track the various channels selected by virtue of a dc shaping network. The output of the controlled oscillator is fed directly to one or more counter/decoder/display units, preferably in integrated circuit form, wherein the signal information is counted, decoded and reset to selectively control one or more display devices such as a Numatron tube or the like.

10 Claims, 6 Drawing Figures

CHANNEL SELECTION
VS.
OSCILLATOR OUTPUT FREQUENCY

| LO VHF | HI VHF | UHF |
|---|---|---|
| CH. 2 — 120 Hz | CH. 7 — 420 Hz | CH. 14 — 840 Hz |
| CH. 3 — 180 Hz | CH. 8 — 480 Hz | CH. 15 — 900 Hz |
| CH. 4 — 240 Hz | ——— | ——— |
| CH. 5 — 300 Hz | CH. 11 — 660 Hz | CH. 82 — 4920 Hz |
| CH. 6 — 360 Hz | CH. 13 — 780 Hz | CH. 83 — 4980 Hz |

CHANNEL INDICATOR AND DISPLAY ARRANGEMENT UTILIZING D-C TUNING VOLTAGES OF VARACTOR TUNER

BACKGROUND OF THE INVENTION

The present invention relates generally to indicator apparatus and more particularly to an improved channel indicator and display arrangement especially suited to television receiver applications and which operates directly from the *dc* tuning voltage generated for selective control of the associated varactor devices in the associated receiver's tuner mechanism.

As known in the art, variable capacitance, voltage-dependent diodes, (or varactors), may be readily accomodated in a wide variety of electronic receiver apparatus. In such case, the frequency to which the receiver is tuned is determined by the magnitude of *dc* voltage as applied to an associated varactor diode device in the tuner mechanism. There has been a definitive trend in recent years to include such varactor tuned tuner mechanism in television receivers to obtain equalized tuning for both VHF and UHF channel selection. A good many arrangements for such tuners are already known in the art of one sort or another.

One of the disadvantages of such varactor tuners, or operational characteristic at least, is the lack of physical correlation with respect to the channel being selected. Unlike the mechanical tuner arrangement where rotation of the selector knob also effects a visual indication of some sort or another of the channel being selected, varactor tuners have no such mechanical interplay and separate means must be provided for the required visual readout. In the past, this has taken a wide variety of forms, all of which may be characterized as either being overly complex or expensive to implement, or both.

What is needed, then, is a simplified yet reliable display arrangement that will respond directly to the tuning voltages, themselves, as generated for the selective control of the varactor diode or diodes in the receiver tuner mechanism. At the same time, the display arrangement must be reasonably simple in operation, relatively economical to fabricate yet provide reliable operation.

Accordingly, an object of the present invention is to provide a visual indication of a channel or frequency selection in an electronic apparatus by utilizing the *dc* tuning voltage generated for control of the frequency determining element, such as a varactor diode.

A more particular object of the present invention is to provide an improved visual digital channel readout arrangement for a television receiver which is directly responsive to the tuning voltage as generated and selectively applied to one or more varactor diodes in an associated tuner mechanism so as to effect continuous and automatic display of the channel to which the television receiver is tuned at any particular time.

Another object of the present invention is to provide an improved digital channel display arrangement of the foregoing type wherein a *dc* controlled oscillator is provided having an output frequency which may be made proportional to channel indication across the entire frequency range.

Still another object of the present invention is to provide an improved channel indicator and display arrangement of the foregoing type which is compatible with a number of visual display devices that may be used to indicate channel selection.

Yet another object of the present invention is to provide an improved channel indicator and display arrangement of the foregoing type which is substantially simple in operation yet less costly to fabricate than prior systems.

SUMMARY OF THE INVENTION

In practicing the invention, a *dc* controlled oscillator is provided which is made responsive to the *dc* tuning voltages as generated and selectively applied to one or more of the varactor diodes in the receiver's tuner mechanism. The tuning voltage as generated for each channel selection when applied to the controlled oscillator results in an output signal the frequency of which in an integral multiple of a 60 cycle reference or timing signal. This is made possible by a *dc* shaping network which adjusts the slope and direction of various segments of the generated tuning voltage so as to closely approximate the response curve of the varactor tuner with respect to the exhibited frequency *v* voltage characteristics.

The output of the controlled oscillator is then fed directly to a counter-latch-decoder arrangement which in turn controls one or more display devices, such as a seven-segment Numatron tube or the like, for visually displaying the selected channel. Accordingly, the channel number is counted and displayed directly without the need of complex logic circuitry or high speed counters.

BRIEF DESCRIPTION OF THE DRAWINGS

The features of the present invention which are believed to be novel are set forth with particularlity in the appended claims. The invention itself, however, together with further objects and advantages thereof, may be better understood by reference to the accompanying drawings, in which:

DESCRIPTION OF THE PREFERRED EMBODIMENT

Figure 1:
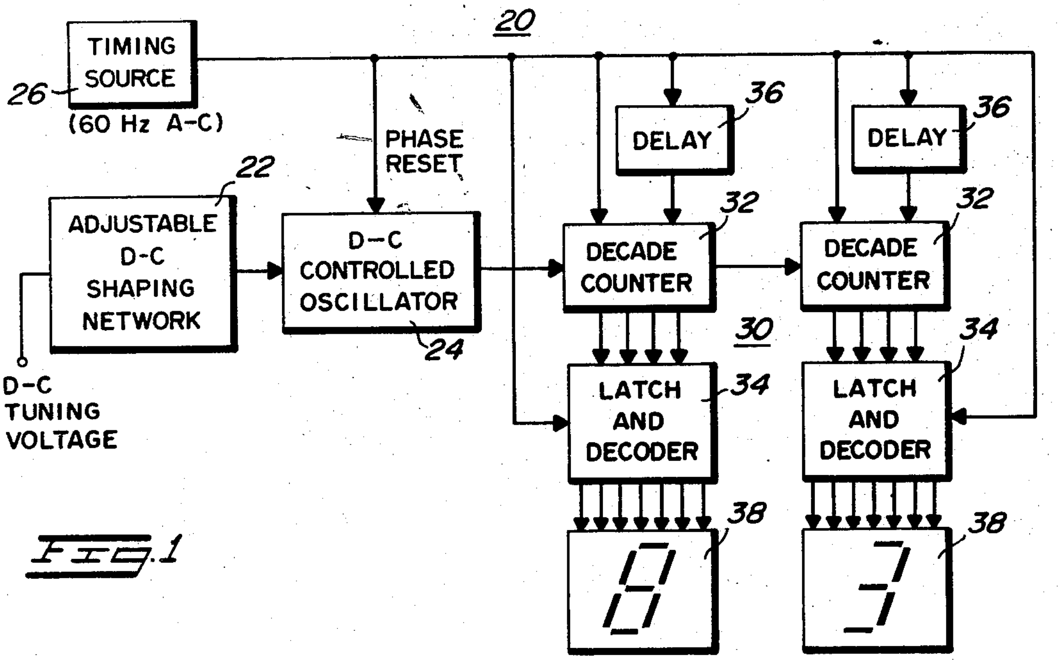
FIG. 1 is a block diagram of a channel indicator and display arrangement for a television receiver with varactor tuning devices, which arrangement has been constructed in accordance with the present invention.

Referring now to the drawings, a channel indicator and display arrangement 20 is shown in FIG. 1 which has been constructed in accordance with the present invention. As indicated, the indicator apparatus 20 is designed to respond directly to the range of *dc* tuning voltages generated and applied to one or more of the varactor diode devices (not shown) included, say for example, in a tuner mechanism of a television receiver. As shown, apparatus 20 includes an adjustable *dc* shaping network 22 to which the *dc* tuning voltage may be applied. The output of network 22 is in turn applied to one input of a *dc* controlled oscillator 24.

By appropriate adjustment of network 22, the output of controlled oscillator 24 is an oscillatory signal, or more correctly, a series of recurrent pulses having a frequency which represents a specific multiple of a 60 cycle reference signal, as generated by the timing source 26. That is, for Channel 2, the output of oscillator 24 will be approximately 120 Hz, or 2 × 60 Hz. For Channel 7, on the other hand, the output frequency of oscillator 24 will be 7 × 60 Hz, or 420 Hz. As will be apparent, the table of FIG. 6 sets forth the full range of output frequencies for controlled oscillator 24 with respect to each of the selectable television channels, in both the VHF and UHF frequency ranges.

Figure 4:
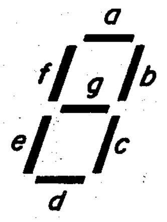
FIG. 4 identifies the various control segments of a typical display device.
Figure 3:
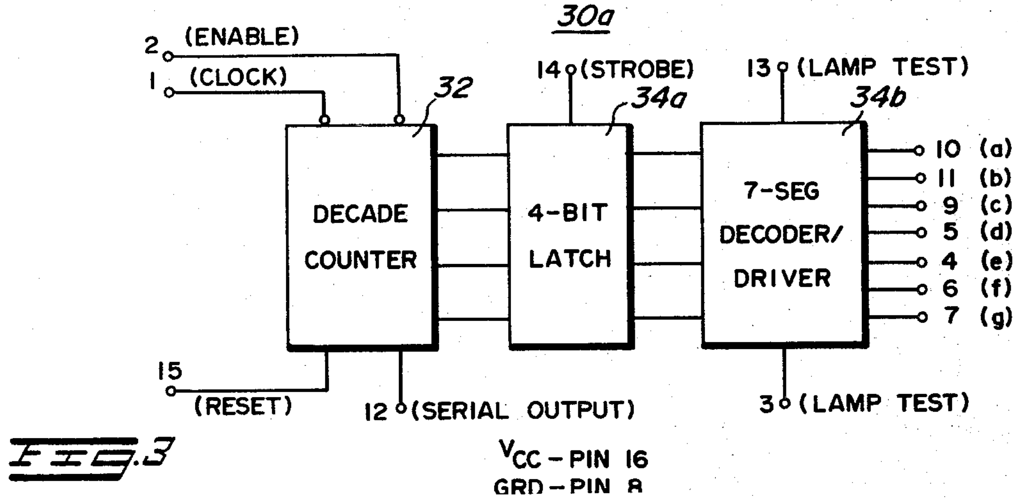
FIG. 3 is a graphic representation of an Integrated Circuit combining the functions of a decade counter, four-bit latch and seven-segment decoder for selectively controlling suitable display devices.

The signal information at the output of controlled oscillator 24 may then be applied to a decoder/display arrangement 30 wherein the generated pulses are suitably counted, decoded, and then displayed in visual digital array. Both the decoding and display apparatus, indicated generally at 30, may be of any of several known and commercially available devices. One such arrangement found to provide satisfactory operation is illustrated in block diagram form at 30a in FIG. 3. As indicated, the complete package comprises a monolithic MSI Integrated Circuit combining the functions of an NBCD Counter, identified at 32, a four-bit or quad latch 34*a*, and a seven-segment decoder/driver 34*b*. The circuit includes some sixteen reference terminals, the function of each being as indicated in FIG. 3. The counter 32 advances on the negative edge of the clock pulse, subject to control by the enable input. As shown, terminals 4, 5, 6, 7, 9, 10 and 11 serve as the high-current driver outputs for selectively controlling the associated display device 38. Device 38 may be a Numatron tube, for example, having a seven-segment display, as shown in FIG. 4. The particular segments selectively controlled by each of decoder/driver outputs are graphically tabulated in FIG. 3.

It is to be understood that the counter/latch/decoder 30a apparatus may be obtained in a single package as an essentially off-the-shelf item, and is available from various commercial sources. Two such Integrated Circuit packages, along with the associated display devices 38, comprise the overall decoder/display indicated at 30 in FIG. 1.

Figures 5, 6:
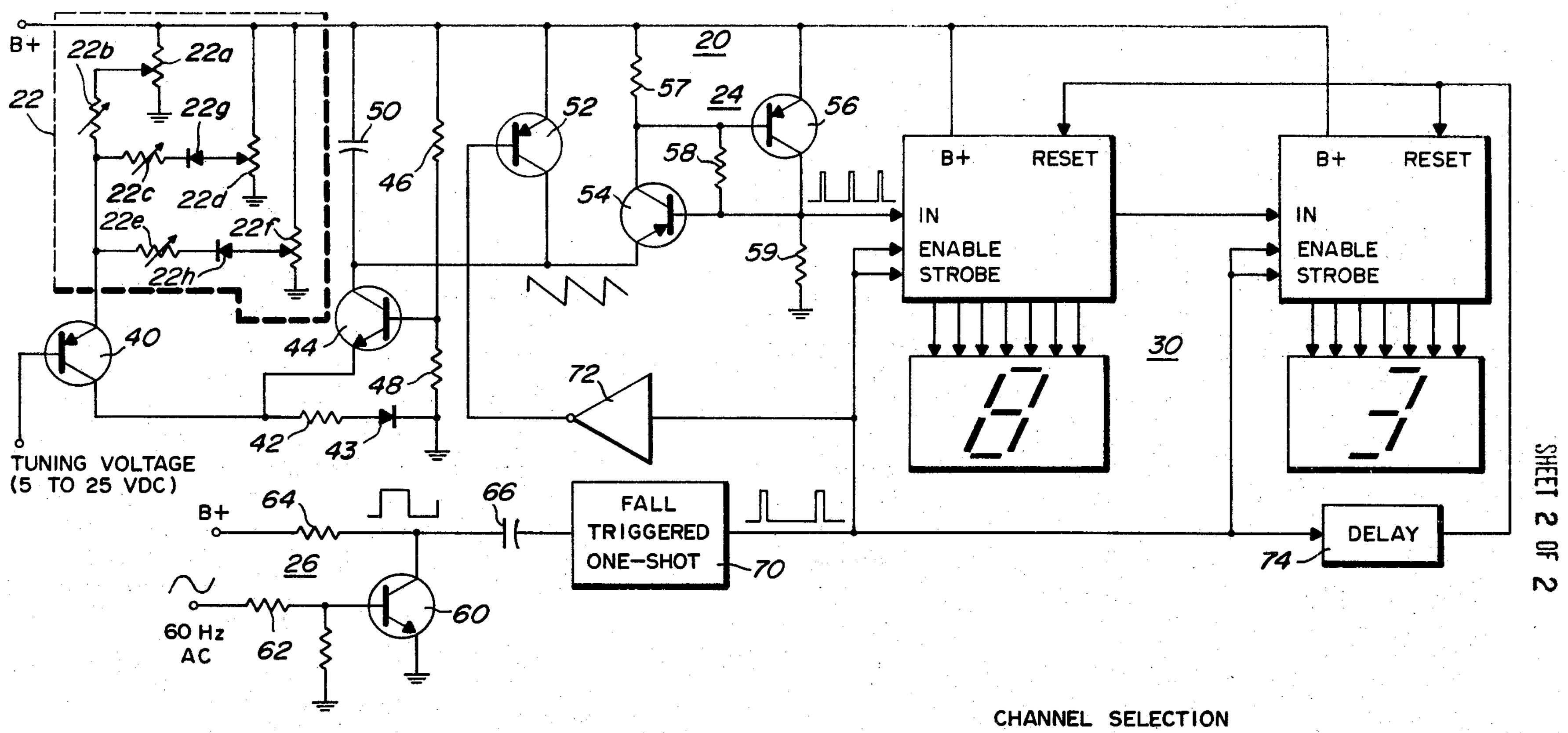
FIG. 5 is a schematic and block diagram representative of the indicator and display arrangement of FIG. 1.
FIG. 6 is a table of output frequencies of the *dc* controlled oscillator as shown in FIGS. 1 and 5 with respect to the selection of television channels.

A more detailed schematic representation for channel indicator and display 20 is illustrated in FIG. 5. As indicated, the tuning voltage generated for control of the receiver's varactor diode devices (not shown) may be applied to the base input of a transistor amplifier 40. The emitter of transistor 40 is coupled to the *dc* shaping network 22. The collector of transistor 40 is connected to a junction formed by a resistor 42 and a diode 43 to ground and the emitter electrode of still another transistor 44. Transistor 44 serves as a current source for the *dc* controlled oscillator 24. A fixed bias is provided to the base of transistor 44 by the voltage divider network of resistors 46 and 48 connected between B+ and ground, as shown.

A current storage device or capacitor 50 is also connected between the B+ source and the collector of transistor 44. The collector of transistor 44 is further connected to a junction of the collector of a further transistor 52 and the emitter of an additional transistor 54. Transistor 54, in conjunction with an associated transistor 56, serves as the *dc* controlled oscillator 24. The output of oscillator 24 is taken at the junction of the base of transistor 54 and the collector of transistor 56. Bias and operating power is provided by the network of resistors 57, 58 and 59, connected in a manner as shown. Transistor 52 serves as a phase reset, the purpose of which will become clear subsequently.

The timing source 26 comprises a transistor amplifier 60 connected to a source of 60 Hz *ac* through a limiting resistance 62, as indicated. Operating power is applied to the collector through a further resistance 64. Transmitter 60 thus serves as a squaring circuit. The generated 60 cycle square wave is then *ac* coupled through a capacitor 66 to a one-shot multivibrator 70. The output of multivibrator 70 is a series of recurrent pulses of predetermined width and amplitude but at a fixed 60 Hz rate, which then serves as the timing source or signal. The timing pulses are coupled to the "enable" and "strobe" inputs of the decoder portion of the decoder/display arrangement 30, and also to an inverter 72, the output of the latter being coupled to the base input of the phase reset transistor 52. The timing pulses are applied as well to a preset delay device 74, wherein the suitably delayed pulses are applied to the reset terminal of the decoder devices of the decoder/display arrangement 30, as indicated.

Figure 2:
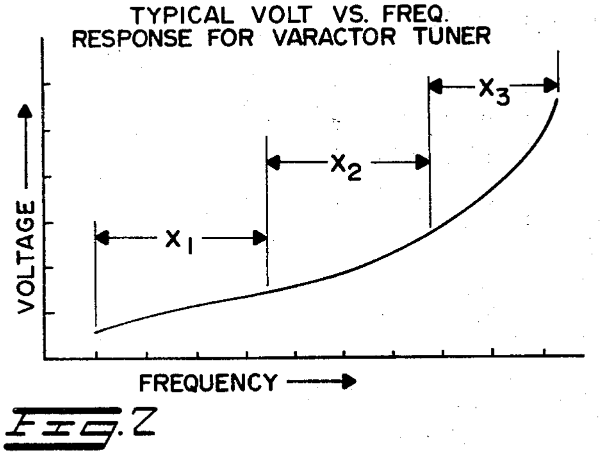
FIG. 2 is a typical tuning voltage *v* frequency response curve for a varactor tuner mechanism and which is useful in understanding certain aspects of the present invention.

In operation, the tuning voltage, in the range of 5 to 25 vdc, is applied to the input base of transistor 40. The *dc* shaping network 22 is then adjusted so that the digital readout of display 38 selectively track the channels actually being selected. This is effected by setting the various potentiometers 22*a* through 22*f* so that substantially the same type of response curve at the output of transistor 40 is obtained as is exhibited by the associated varactor tuner mechanism in the receiver. For example, potentiometer 22*b* may be adjusted to provide the desired slope as exhibited during the interval designated $X_1$ as set forth in FIG. 2. Potentiometer 22*c* is then adjusted to affect the desired slope during indicated interval $X_2$ while potentiometer 22*e* is utilized to affect the same during interval $X_3$. Potentiometer 22*a* may then be adjusted to control the start of the slope for interval $X_1$, potentiometer 22*d* the slope start for interval $X_2$, and potentiometer 22f the slope start for interval $X_3$. The result is a direct correlation between the output of controlled oscillator 24 and the varactor tuner, in terms of channel selection, even though the frequency scale differs. That is, the tuner frequency is in megahertz while the output frequency of the controlled oscillator 24 is in the range of 120 to 4,980 Hz.

With a given voltage applied to the base of transistor 40, it will be appreciated that a predetermined conduction level is initiated, which further renders transistor 44 conductive. Capacitor 50 then begins to charge up. As the voltage on capacitor 50 common to the collector of transistor 44 drops in ramp fashion to a predetermined level, transistor 54 will momentarily conduct to discharge the capacitor 50. This in turn renders transistor 56 conductive and a sharp positive-going voltage spike appears at the collector of transistor 56. In point of fact, transistor 54 and transistor 56 work in conjunction with each other so as to exhibit operating characteristics similar to that of a unijunction transistor device. In any event, however, the charging rate of capacitor 50, which in turn determines the number of instances transistor 54 conducts within the prescribed time reference, is set by the level of *dc* voltage as applied to the base input of transistor 40. It will be appreciated that the higher the voltage level, the faster the charging rate for capacitor 50 and thus the number of times transistor 54 and 56 conduct within the prescribed time period.

The time or counting period, of course, is set by the timing source 26. A timing pulse at the output of the one-shot multivibrator 70 starts the counting cycle when applied to the "enable" input of the decoder/display apparatus 30. The counting cycle ends when the timing pulse has been delayed a predetermined amount by delay network 74 and applied to the reset reference terminals, as indicated. A new timing cycle starts upon the generation of the next timing pulse and the cycle progresses as before.

As mentioned previously, the timing signal or pulse is likewise applied, through inverter 72, to the base input of transistor 52 functioning as a phase reset. It will be appreciated, then, that transistor 52 conducts momentarily for the duration of the applied pulse. Thus, any residual charge on capacitor 50 is thereby effectively discharged and each timing cycle begins with capacitor 50, and in turn the emitter of transistor 54, being fixed at the same reference level. This not only insures accuracy in the counting operation but also permits some degree of tolerance in the set up procedure and various component values. In this way, the output frequency of the controlled oscillator 24 may vary up to 60 Hz and still provide the correct channel indication. For example, a readout for Channel 2 will be obtained for an output frequency anywhere in the range of 120 to 180 Hz. Channel 3 will read on an output between 180 and 240 Hz, and so forth.

While a particular embodiment of the invention has been shown and described therein, it will be obvious to those skilled in the art that various modifications and alternative constructions may be made without departing from the true scope and spirit of the present invention in its broader aspects, and, therefore, the aim in the appended claims is to cover all such changes and modifications as may fall within the true scope and spirit of the invention.

What is claimed is:

1. A digital channel indicator and display arrangement for use with a varactor tuner mechanism, comprising in combination:

a source of *dc* tuning voltage generated to selectively control the frequency of the varactor tuner;

controlled oscillator means responsive to said *dc* tuning voltage for effecting an output in the form of recurrent pulses, the frequency of which is dependent upon the level of applied *dc* tuning voltage;

*dc* shaping means for controlling the slope of various segments of said *dc* tuning voltage whereby a direct correlation is obtained between the output signal of said oscillator means and the channel selected by the varactor tuner; and decoder/display means responsive to said recurrent pulses for counting the same, decoding and effecting a digital display thereof.

2. A digital channel indicator and display arrangement in accordance with claim 1 wherein said d-c shaping means is a plurality of impedance paths each comprising at least two adjustable resistance means and wherein at least one of said paths further includes a rectifier device.

3. A digital channel indicator and display arrangement in accordance with claim 1 wherein the counting cycle for said decoder/display means is initiated by a timing pulse generated by a timing source keyed to a 60 Hz *ac* reference.

4. A digital channel indicator and display arrangement in accordance with claim 3 wherein the output frequency of said controlled oscillator means is a given multiple of said 60 Hz timing source rate for each channel selected by the varactor tuner.

5. A digital channel indicator and display arrangement in accordance with claim 4 wherein said decoder/display means includes a pair of monolithic integrated circuits, each having a decade counter, four-bit latch, and sevensegment decoder/driver selectively controlling the associated digital display readout device.

6. A digital channel indicator and display arrangement in accordance with claim 1 wherein said controlled oscillator means includes a storage device responsive to charge at a given rate with respect to a given level of applied *dc* tuning voltage and means for rapidly discharging said storage device upon the same reaching a predetermined charge level so as to provide a sharp output pulse.

7. A digital channel indicator and display arrangement in accordance with claim 6 wherein said means for discharging said storage device and providing an output pulse comprises a pair of transistors each having a base connected to the collector of the other and wherein said pair of transistors function as a unijunction semiconductor device.

8. A digital channel indicator and display arrangement in accordance with claim 7 wherein the input to said control oscillator means is taken at the emitter of one of said transistors interconnected to said storage device and the output of said controlled oscillator means is taken at the collector of said other transistor.

9. A digital channel indicator and display arrangement in accordance with claim 8 wherein means are included to insure said storage device and said discharge means begin at a fixed, predetermined reference voltage level at the start of each of said timing cycles.

10. A digital channel indicator and display arrangement in accordance with claim 9 wherein said first named means comprises a further transistor having an emitter-collector circuit interposed between a source of unidirectional potential and said emitter of said one transistor of said oscillator means and wherein said further transistor is responsive to each of said timing pulses to conduct momentarily and remove any residual charge on said storage device.

* * * * *